United States Patent
Banin et al.

(10) Patent No.: US 11,870,449 B2
(45) Date of Patent: Jan. 9, 2024

(54) SYSTEMS AND METHODS FOR CALIBRATING DIGITAL PHASE-LOCKED LOOPS

(71) Applicant: Intel Corporation, Santa Clara, CA (US)

(72) Inventors: Elan Banin, Raanana M (IL); Yaniv Cohen, Hod Hasharon (IL); Ofir Degani, Nes-Ammin (IL); Igal Kushnir, Hod-Hasharon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/638,739

(22) PCT Filed: Dec. 28, 2019

(86) PCT No.: PCT/US2019/068847
§ 371 (c)(1),
(2) Date: Feb. 25, 2022

(87) PCT Pub. No.: WO2021/133415
PCT Pub. Date: Jul. 1, 2021

(65) Prior Publication Data
US 2022/0393690 A1    Dec. 8, 2022

(51) Int. Cl.
*H03L 7/099*  (2006.01)
*G06F 1/08*   (2006.01)
*H03L 7/093*  (2006.01)

(52) U.S. Cl.
CPC .............. *H03L 7/0992* (2013.01); *G06F 1/08* (2013.01); *H03L 7/093* (2013.01)

(58) Field of Classification Search
CPC ..... H03L 2207/50; H03L 7/093; H03L 7/085; H03L 7/08; H03L 7/10; H03L 7/14; H03L 7/104
See application file for complete search history.

(56) References Cited

U.S. PATENT DOCUMENTS

| | | | |
|---|---|---|---|
| 9,395,698 B2 * | 7/2016 | Chang | G04F 10/005 |
| 10,103,741 B2 * | 10/2018 | Gao | H03L 7/0992 |
| 10,594,329 B1 * | 3/2020 | Elkholy | H03L 7/093 |
| 2013/0113536 A1 | 5/2013 | Sfikas et al. | |
| 2013/0223564 A1 | 8/2013 | Mayer et al. | |
| 2015/0280842 A1 | 10/2015 | Mayer et al. | |
| 2018/0287569 A1 | 10/2018 | Xu et al. | |
| 2019/0214944 A1 | 7/2019 | Palaskas et al. | |

OTHER PUBLICATIONS

PCT International Search Report issued for PCT/US2019/068847, 2 pgs., dated Mar. 3, 2020.

(Continued)

*Primary Examiner* — Diana J. Cheng
(74) *Attorney, Agent, or Firm* — Banner & Witcoff Ltd.

(57) ABSTRACT

A clock generator calibration system can include a phased-locked loop and a correction circuit. The PLL can generate an output clock signal, and the correction circuit can adjust a frequency signal of the PLL based on a digital signal of the PLL. The digital signal can be generated based on the adjusted frequency signal.

21 Claims, 6 Drawing Sheets

(56) References Cited

OTHER PUBLICATIONS

Chetniak Dmytro et al:"Digitally-Intensive Fast Frequency Modulators for FMCW Radars in CMOS: (Invited Paper)", Apr. 14, 2019 (Apr. 14, 2019), 2019 IEEE Custom Integrated Circuits Conference (CICC), IEEE, pp. 1-8, XP033586871, [retrieved on Jul. 29, 2019].
Levantino Salvatore et al: "An Adaptive Pre-Distortion Technique to Mitigate the DTC Nonlinearity in Digital PLLs", IEEE Journal of Solid-State Circuits, IEEE, USA, vol. 49, No. 8, Aug. 1, 2014 (Aug. 1, 2014), pp. 1762-1772, XP011554161, ISSN: 0018-9200, DOI: 10.1109/JSSC.2014.2314436[retrieved on Jul. 21, 2014].
Levantino Salvatore et al: "Analysis of Adaptive Pre-Distortion in OTC-based Digital Fractional-N PLLs",2016 12th Conference on PH.D. Research in Microelectronics and Electronics (PRIME), IEEE,Jun. 27, 2016 (Jun. 27, 2016), pp. 1-4, XP032928976, DOI: 10.1109/PRIME.2016.7519527 [retrieved on Jul. 22, 2016].
Elkholy Ahmed et al: "A 3.7 mW Low-Noise Wide-Bandwidth 4.5 GHz Digital Fractional-N PLL Using Time Amplifier-Based TDC", IEEE Journal of Solid-State Circuits, IEEE, USA, vol. 50, No. 4, Apr. 1, 2015 (Apr. 1, 2015), pp. 867-881, XP011576655, ISSN: 0018-9200, DOI: 10.1109/JSSC.2014.2385753 [retrieved on Mar. 24, 2015].
Wu Wanghua et al: "A 28-nm 75-fsrms Analog Fractional—$N$ Sampling PLL with a Highly Linear DTC Incorporating Background DTC Gain Calibration and Reference Clock Duty Cycle Correction", IEEE Journal of Solid-State Circuits, IEEE, USA, vol. 54, No. 5, May 1, 2019 (May 1, 2019), pp. 1254-1265, XP011721041, ISSN: 0018-9200, DOI: 10.1109/JSSC.2019.2899726 [retrieved on Apr. 22, 2019].
Aug. 17, 2023 (EP) Search Report—U.S. Appl. No. 19/957,494.

* cited by examiner

SYSTEMS AND METHODS FOR CALIBRATING DIGITAL PHASE-LOCKED LOOPS

BACKGROUND

Field

Aspects described herein generally relate to digital phase-locked loops (PLLs), including systems and methods for estimating of, and calibrating for, integrated-nonlinearity of the digital-to-time converter (DTC).

Related Art

Wireless communications and radar systems having increased data rates require high precision synchronization clock generation. Such systems may use one or more PLLs. Conventional PLLs require a dedicated full-range time-to-digital converter (TDC) with high resolution, a dedicated short-TDC with high resolution and a configurable delay element, and dedicated feedback. Also, conventional systems require dedicated hardware, such as TDCs, analog-to-digital converter (ADC), and/or feedback to the digital domain.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Aspects described herein generally relate to digital phase-locked loops (PLLs), including systems and methods for estimating of, and calibrating for, integrated-nonlinearity of the digital-to-time converter (DTC).

Wireless communication devices may be configured for multiple radio access technologies (RATs). In these examples, the transceiver(s) of the communication device can be configured to perform carrier aggregation. Example RATs include (but are not limited to), 2G, 3G, 4G, LTE, 5G, satellite navigation technologies (e.g. GNSS), BT, WiFi, CDMA, or one or more other wireless technologies as would be understood by one of ordinary skill in the art.

The aspects herein are applicable to transmitters, receivers, and other electronic devices requiring one or more accurate clock generations as would be understood by one of ordinary skill in the art. Although aspects are described with respect to wireless communications, the present disclosure is not limited to wireless communication implementations and can include other applications that use clock generators and synchronizations using such generated clock(s), including, wired communications, data processing, encryption, or the like.

Figure 1:
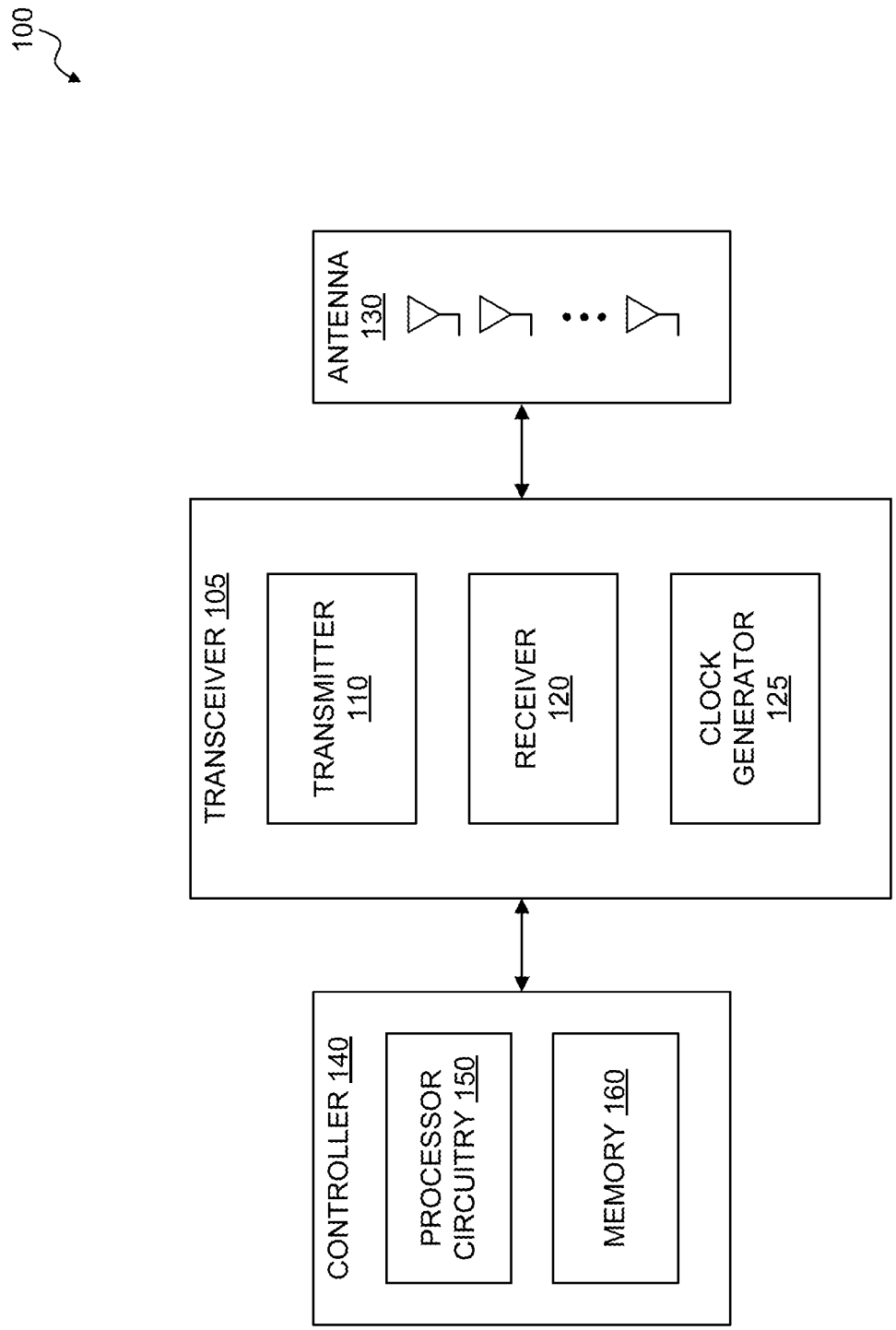
FIG. 1 illustrates a communication device according to an exemplary aspect of the present disclosure.

FIG. 1 illustrates a communication device 100 according to an exemplary aspect of the present disclosure. The communication device 100 is configured to transmit and/or receive wireless communications via one or more wireless technologies. For example, the communication device 100 can be configured for wireless communications conforming to, for example, one or more fifth generation (5G) "New Radio" cellular communication protocols, such as one or more 5G protocols as would be understood by one of ordinary skill in the art. The communication device 100 is not limited to these communication protocols and can be configured for one or more additional or alternative wireless and/or wired communication protocols, such as one or more 3rd Generation Partnership Project's (3GPP) protocols (e.g., Long-Term Evolution (LTE)), one or more wireless local area networking (WLAN) communication protocols, and/or one or more other communication protocols as would be understood by one of ordinary skill in the relevant arts.

The communication device 100 can be configured to communicate with one or more other communication devices, including, for example, one or more base stations, one or more access points, one or more other communication devices, and/or one or more other devices as would be understood by one of ordinary skill in the relevant arts. Although the exemplary aspects of the communication device 100 are described with respect to wireless communications, the communication device 100 can be configured for one or more wired communication technologies as would be understood by one of ordinary skill in the relevant arts.

In an exemplary aspect, the communication device 100 includes a controller 140 communicatively coupled to one or more transceivers 105. The transceiver 105 is configured to transmit and/or receive wireless communications via one or more wireless technologies. In an exemplary aspect, the transceiver 105 includes processor circuitry that is configured for transmitting and/or receiving wireless communications conforming to one or more wireless protocols. In other aspects, additionally or alternatively, the transceiver 105 is configured to transmit and/or receive wired communications via one or more wired technologies. In an exemplary aspect, the processor circuitry of the transceiver 105 is configured for transmitting and/or receiving wired communications conforming to one or more wired protocols.

In an exemplary aspect, the transceiver 105 includes a transmitter 110 and a receiver 120 configured for transmitting and receiving wireless communications, respectively, via one or more antennas 130. In wired communication aspects, the transmitter 110 and the receiver 120 are configured for transmitting and receiving wired communications, respectively.

In aspects having two or more transceivers 105, the two or more transceivers 105 can have their own antenna 130, or can share a common antenna via a duplexer. In an exemplary aspect, the transceiver 105 (including the transmitter 110 and/or receiver 120) is configured to perform one or more baseband processing functions (e.g., media access control (MAC), encoding/decoding, modulation/demodulation, data symbol mapping; error correction, etc.).

In an exemplary aspect, the transceiver 105 additionally includes a clock generator 125 that is configured to generate one or more high precision synchronization clock signals. The clock signal(s) can be used by the transmitter 110, receiver 120, one or more other components of the transceiver 105, the controller 140, and/or one or more other components of the communication device 100. In an exemplary aspect, the clock generator 125 includes processor circuitry that is configured to perform one or more operations and/or functions of the clock generator 125, including generating one or more clock signal(s).

The antenna 130 can be a single antenna, include multiple antennas, or include one or more antenna elements forming an integer array of antenna elements. In an exemplary aspect, the antenna 130 is a phased array antenna that includes multiple radiating elements (antenna elements) each having a corresponding phase shifter. The antenna 130 configured as a phased array antenna can be configured to perform one or more beamforming and/or beam-scanning operations. The beamforming operations can include generating beams formed by shifting the phase of the signal emitted from each radiating element to provide constructive/destructive interference so as to steer the beams in the desired direction.

In an exemplary aspect, the controller 140 includes processor circuitry 150 that is configured to control the overall operation of the communication device 100, such as the operation of the transceiver(s) 105. The processor circuitry 150 may be configured to control the transmitting and/or receiving of wireless communications via the transceiver(s) 105 and/or control phase shifting and/or amplifier gain values associated with antenna elements of the antenna 130.

In an exemplary aspect, the processor circuitry 150 is configured to perform one or more baseband processing functions (e.g., media access control (MAC), encoding/decoding, modulation/demodulation, data symbol mapping; error correction, etc.) in cooperation with the transceiver 105 or instead of such operations/functions being performed by the transceiver 105. The processor circuitry 150 is configured to run one or more applications and/or operating systems; power management (e.g., battery control and monitoring); display settings; volume control; and/or user interactions via one or more user interfaces (e.g., keyboard, touchscreen display, microphone, speaker, etc.) in one or more aspects.

In an exemplary aspect, the controller 140 further includes a memory 160 that stores data and/or instructions. When the instructions are executed by the processor circuitry 150, the processor circuitry 150 performs the associated functions described herein.

The memory 160 may be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory 160 can be non-removable or removable, or a combination of both. The controller 140 can additionally or alternatively be configured to access an external memory to store data within, or retrieve data from, the external memory.

Examples of the communication device 100 include (but are not limited to) a mobile computing device (mobile device)—such as a laptop computer, a tablet computer, a mobile telephone or smartphone, a "phablet," a personal digital assistant (PDA), and mobile media player; a wearable computing device—such as a computerized wrist watch or "smart" watch, and computerized eyeglasses; and/or internet-of-things (IoT) device. In some aspects of the present disclosure, the communication device 100 may be non-handheld communication device, including, for example, a stationary computing device—such as a personal computer (PC), a desktop computer, television, smart-home device, security device (e.g., electronic/smart lock), automated teller machine, a computerized kiosk, an autonomous vehicle, drone, and/or an automotive/aeronautical/maritime in-dash computer terminal.

In one or more aspects, the communication device 100 or one or more components of the communication device 100 is additionally or alternatively configured to perform digital signal processing (e.g., using a digital signal processor (DSP)), modulation and/or demodulation (using a modulator/demodulator), a digital-to-analog conversion (DAC) and/or an analog-to-digital conversion (ADC) (using a respective DA and AD converter), an encoding/decoding (e.g., using encoders/decoders having convolution, tail-biting convolution, turbo, Viterbi, and/or Low Density Parity Check (LDPC) encoder/de-coder functionality), frequency conversion (using, for example, mixers, local oscillators, and filters), Fast-Fourier Transform (FFT), precoding, and/or constellation mapping/de-mapping to transmit and/or receive wireless communications conforming to one or more wireless protocols and/or facilitate the beamforming scanning operations and/or beamforming communication operations.

Figure 2A:
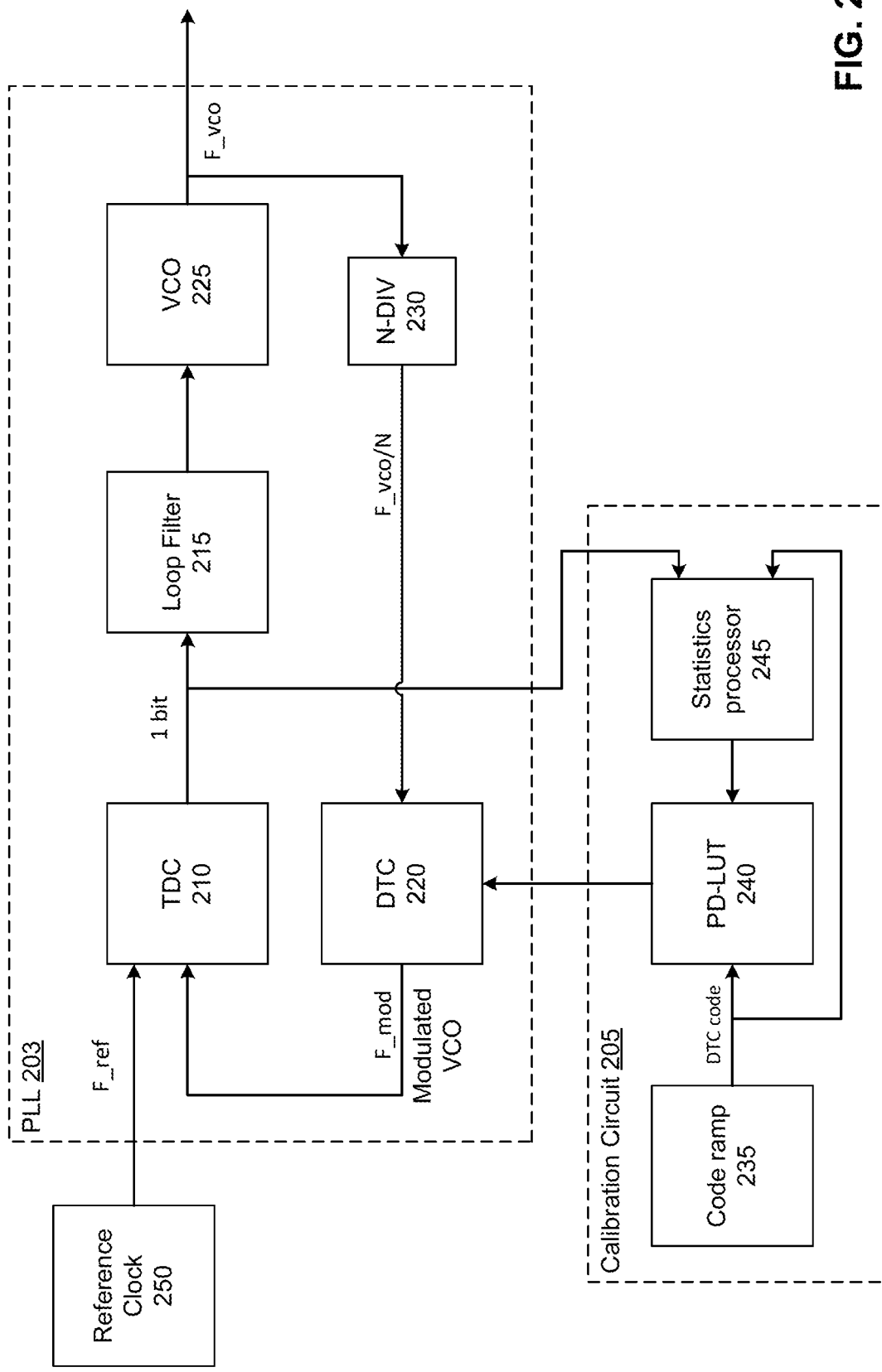
FIG. 2A illustrates a clock generator according to an exemplary aspect of the present disclosure.
Figure 2B:
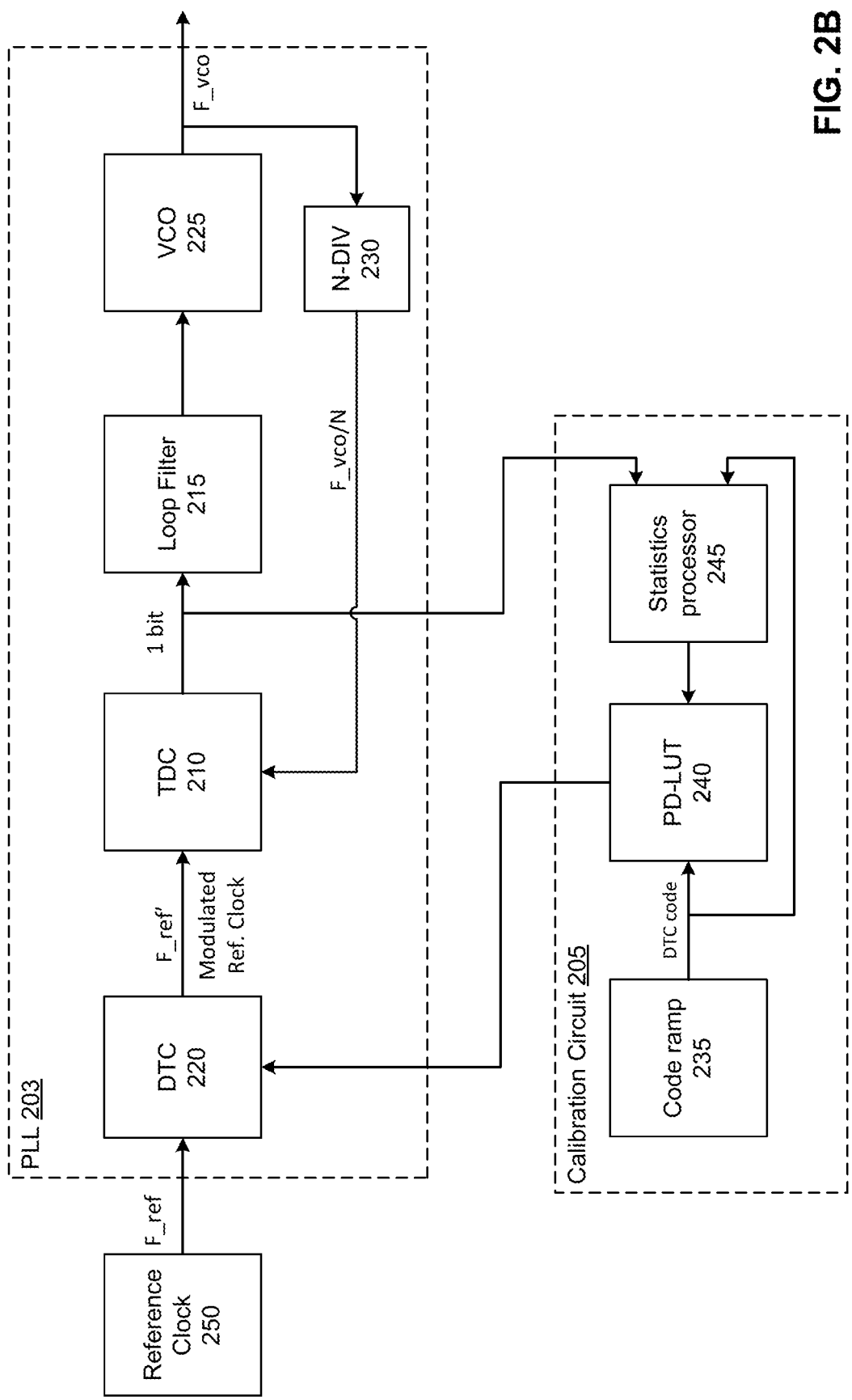
FIG. 2B illustrates a clock generator according to an exemplary aspect of the present disclosure.

FIG. 2A illustrates a clock generator 200 according to an exemplary aspect of the present disclosure. FIG. 2B illustrates a clock generator 201 according to an exemplary aspect of the present disclosure. The clock generators 200 and 201 can be implemented in the communication device 100 as clock generator 125 in one or more aspects.

In an exemplary aspect, the clock generators 200/201 include a phased-lock loop (PLL) 203 and a calibration circuit 205 that is configured to calibrate the clock generator 200/201. The PLL 203 can be supplied with (e.g. driven by) a reference clock signal generated by reference clock oscillator 250, such as a crystal oscillator. Although the illustrated examples show the oscillator 250 being external to the clock generator 200 and PLL 203, the oscillator 250 can be comprised within the clock generator 200 in one or more aspects. In an alternative aspect, the oscillator 250 is comprised within the controller 140, or within another component of the communication device 100.

In an exemplary aspect, the PLL 203 includes a time-to-digital converter (TDC) 210, a loop filter 215, a digital-to-time converter (DTC) 220, voltage-controlled oscillator (VCO) 225, and an N-divider 230. In an exemplary aspect, the loop filter 215 is configured to filter the digital output signal (e.g. 1 bit signal) of the DTC 220 and generate a filtered signal that drives the VCO 225. In an exemplary aspect, the VCO 225 is configured to generate one or more clock signals (F_vco) at one or more respective frequencies that are controlled by the filtered signal provided by the loop filter 215.

In operation, the output clock signal of the VCO 225 is fed back to the N-divider 230. In an exemplary aspect, the N-divider 230 is configured to divide the output clock signal clock signal from the VCO 225 by N to obtain feedback signal (F_vco/N). The feedback signal is then provided to the DTC 220 as shown in FIG. 2A or to the TDC 210 as shown in FIG. 2B. The N-divider 230 can be adjusted (e.g. the value of N can be adjusted), for example, based on an external frequency programming signal. In an exemplary aspect, the N-divider 230 is a frequency or fractional divider.

In an exemplary aspect shown in FIG. 2A, the clock generator 200 is configured such that the DTC 220 is within the feedback path of the PLL 203 and modulates the output signal (F_vco/N) of the VCO 225 to generate modulated signal (F_mod). In the alternative aspect of the clock generator 200 illustrated in FIG. 2B, the DTC 220 modulates the reference clock signal (F_ref) of the reference clock oscillator 250 to generate a modulated reference clock signal (F_ref'), and provides the modulated reference clock signal (F_ref') to the TDC 210. In an exemplary aspect, one or more of the components of the PLL 203 includes processor circuitry that is configured to perform one or more operations and/or functions of the respective components of the PLL 203.

In an exemplary aspect, the TDC 210 is a bang-bang TDC, but is not limited thereto. In an exemplary aspect illustrated in FIG. 2A, the TDC 210 is configured to: receive a reference clock signal (F_ref) generated by reference oscillator 250 and modulated signal (F_mod) generated by the DTC 220. In this example, the DTC 220 generates the modulated signal (F_mod) based on the feedback signal from VCO 225 that has been divided by the N-divider 230. The TDC 210 can compare the reference clock signal and the DTC output signal and generate a digital output signal (e.g. 1 bit signal) based on the comparison of the reference clock signal and the DTC output signal.

In an exemplary aspect, the TDC 210 is configured to measure a time interval of the reference clock signal and/or the feedback signal, and convert the reference clock signal, the feedback signal, and/or a comparison of the reference clock and feedback signals into digital (e.g. binary) output. The digital output signal generated by the TDC 210 is then provided from the TDC 210 to the loop filter 215. In an exemplary aspect, the TDC 210 is configured to determine which signal edge (reference signal edge or the DTC output signal edge). In this example, the output of the TDC 210 is positive one (+1) when the reference edge is first, and negative 1 (−1) when the edge of the TDC output signal is first.

In an exemplary aspect, the calibration circuit 205 is configured to calibrate the clock generator 200/201 to correct integral nonlinearity (INL) of the DTC 220 of the PLL 203. Prior to correction, the INL can be referred to as the inherent impairment of the DTC 220. After correction/pre-distortion, any remaining INL can be referred to as the residual INL.

In an exemplary aspect, the calibration circuit 205 includes a code ramp 235, pre-distortion (PD) look-up table (LUT) 240, and statistics processor 245. In an exemplary aspect, one or more of the components of the calibration circuit 205 includes processor circuitry that is configured to perform one or more operations and/or functions of the respective components of the calibration circuit 205.

In an exemplary aspect, the code ramp 235 is configured to generate a desired DTC code (e.g. a code ramp) to control the operation of the PD-LUT 240. In this example, the PD-LUT 240 is configured to generate a control signal that controls modulation operation of the DTC 220 (e.g. modulation of the feedback signal (FIG. 2A) or modulation of the reference clock signal (FIG. 2B)).

Figure 3:
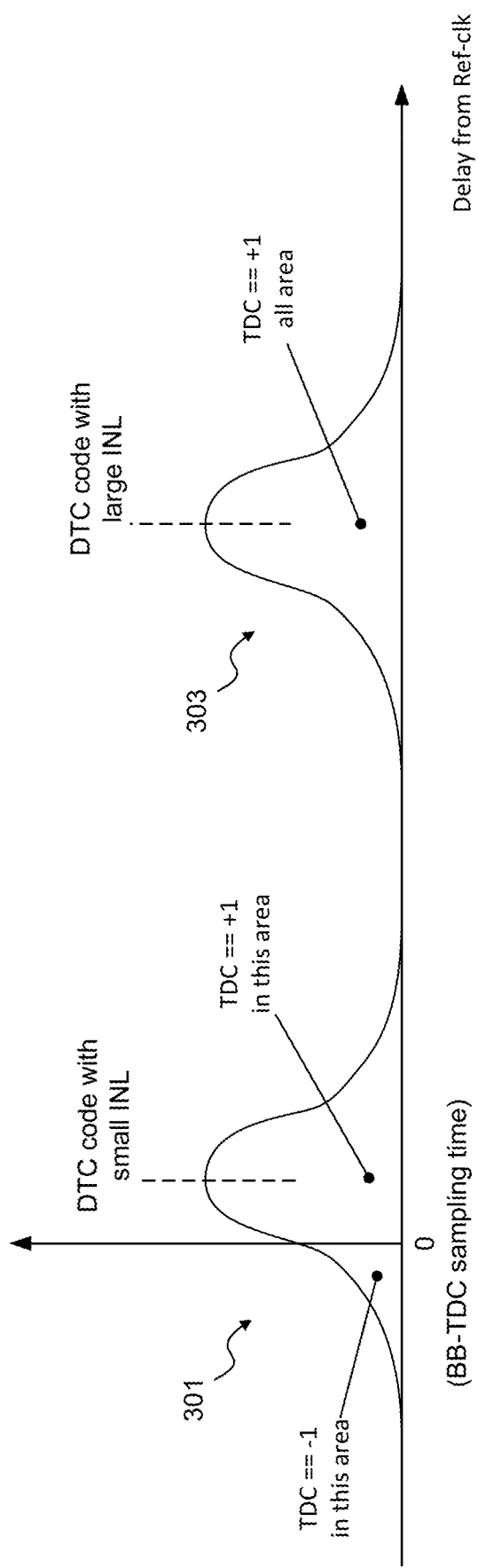
FIG. 3 illustrate histogram distributions according to exemplary aspects of the present disclosure.

In an exemplary aspect, the statistics processor 245 is configured to receive (e.g. sample) the output of the TDC 210 and the output of the desired DTC code generated by the code ramp 235. The statistics processor 245 is configured to determine a distribution (e.g. histogram distribution as shown in FIG. 3) of the TDC output signal, and generate a correction signal (e.g. offset value) based on the determined distribution to correct the control signal generated by the PD-LUT 240. In an exemplary aspect, the collection of statistics by the statistics processor 245 is performed after the VCO 225 has locked onto a frequency.

In an exemplary aspect, the statistics processor 245 is configured to determine the distribution based on the received TDC output signal and the DTC code generated by the code ramp 235. In this example, the statistics processor 245 counts how many times the TDC output is −1 and how many times the TDC output is +1, for the corresponding DTC code provided by the code ramp 235. From these statistics, the statistics processor is configured to adapt the PD-LUT 240 with a determined adjustment/offset value. For example, if the DTC code has a value of k, and this results in a output of the TDC 210 having a 30:70 distribution (e.g., TDC output is −1 30% of the time and +1 70% of the time), the PD-LUT 240 is corrected/adjusted by the statistics processor 245 to offset the output of the PD-LUT 240 so that the resulting TDC 210 approaches and/or achieves a 50:50 distribution.

For example, if the DTC code has an integral nonlinearity (e.g. 5 ps) that significantly exceeds the system jitter (e.g. all the noises in the system amount to jitter of 0.5 ps RMS), the DTC code will result in a significant offset between the edges (at the input of TDC 210). As illustrated in FIG. 3, this will cause the output of the TDC 210 to almost always return a +1 value. This would result in a histogram distribution 303 as shown in FIG. 3.

Alternatively, if the DTC code has an integral nonlinearity that is closer in value (e.g. 1 ps) to the jitter (e.g. 0.5 ps), the output of the TDC 210 will return +1 in some cases, and −1 in other cases, for the corresponding DTC code (due to the gaussian distribution of the jitter). This scenarios is illustrated in the histogram distribution 301 in FIG. 3.

That is, in scenarios where the integral nonlinearity is significantly greater than the jitter-RMS, the statistics processor 245 is configured to detect the sign of the integral nonlinearity, but the magnitude it undetectable until the difference between the magnitudes of the integral nonlinearity and the jitter-RMS become closer. When the difference between the magnitudes of the integral nonlinearity and the jitter-RMS become less significant, the statistics processor 245 may determine statistics with respect to the TDC 210 output (e.g. 30%−1 s, 70%+1 s). Based on these statistics, and as explained in more detail below, the statistics processor 245 may advantageously accurately calculate the magnitude of the integral nonlinearity.

In an exemplary aspect, the statistics processor 245 is configured to perform a calibration process to adapt and adjust the PD-LUT 240. The calibration process can include: (1) a coarse correction process; and/or (2) a fine correction process.

In an exemplary aspect, if the integral nonlinearity is significantly greater than the jitter-RMS, the statistics processor 245 can employ the coarse correction process until the histogram distribution for the particular DTC code produces both positive and negative integral nonlinearity values. The statistics processor 245 may then employ the fine correction process. The coarse correction and fine correction processes are discussed in detail below.

Coarse Correction

In an exemplary aspect, when the inertial nonlinearity values are greater than the jitter distribution (e.g. significantly greater that the distribution returns only positive or negative inertial nonlinearity values), the statistics processor 245 performs an iterative coarse correction. The coarse correction process is discussed with reference to FIG. 4.

Figure 4:
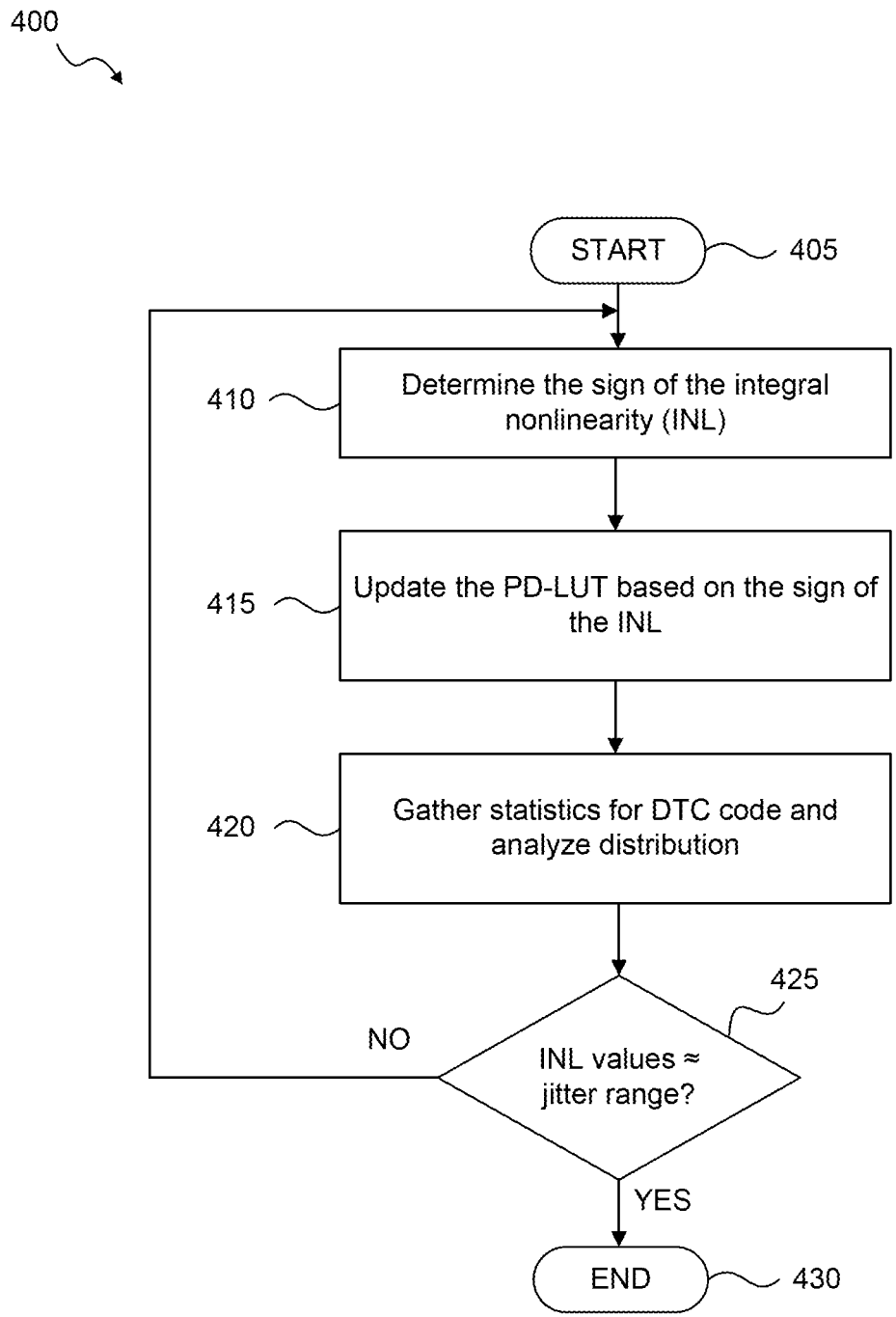
FIG. 4 illustrates a flowchart of a coarse correction method according to an exemplary aspect of the present disclosure.

FIG. 4 illustrates a flowchart 400 of a coarse correction method according to an exemplary aspect of the present disclosure. The flowchart 400 is discussed with reference to FIGS. 1-3.

The flowchart 400 begins at operation 405 and transitions to operation 410, where the sign of the integral nonlinearity (INL) is determined. In an exemplary aspect, the code ramp 235 and PD-LUT 240 perform a calibration sequence where the PD-LUT 240 generates an output corresponding to a desired DTC code word. The statistics processor 245 then records the output of the TDC 210. This is repeated until a sufficient number of records are obtained for the statistics processor 245 to determine the sign of the INL. In an exemplary aspect, the statistics processor 245 is configured to control the code ramp 235 and PD-LUT 240 to perform a calibration sequence.

After operation 410, the flowchart 400 transitions to operation 415, where the PD-LUT 240 is updated based on the determined sign of the INL. In this example, the statistics processor 245 adjusts the output of the PD-LUT 240 (i.e. the PD code) based on the determined sign of the INL. For example, if the DTC code produces more +1 results from the TDC 210, the PD code is reduced. Alternatively, if the DTC code produces more −1 results from the RDC 210, the PD code is increased. Here, the INL remaining after the adjustment is referred to as the residual INL.

After operation 415, the flowchart 400 transitions to operation 420, where additional statistics for DTC code are obtained (e.g. by the statistics processor 245) and the distribution is analyzed (e.g. by the statistics processor 245). In an exemplary aspect, the PD-LUT 240 generates an output corresponding to the desired DTC code word and the statistics processor 245 records the output of the TDC 210. This is repeated until a sufficient number of records are obtained by the statistics processor 245.

After operation 420, the flowchart 400 transitions to operation 425, where it is determined if the INL values (e.g. residual INL) are within the jitter-range (e.g. if INL values≈jitter range). In an exemplary aspect, it is determined (e.g. by the statistics processor 245) if the histogram distribution for the particular DTC code produces both positive and negative integral nonlinearity values (e.g. the output of the PD-LUT 240 toggles around the optimal value; the output of the TDC 210 approaches and/or achieves a 50:50 distribution)

If the operation 425 is in the affirmative (YES), the flowchart 400 transitions to operation 430 and the flowchart 400 ends. Otherwise (NO at operation 425), the flowchart 400 returns to operation 410 and the method repeats in an iterative process.

Fine Correction

Figure 5:
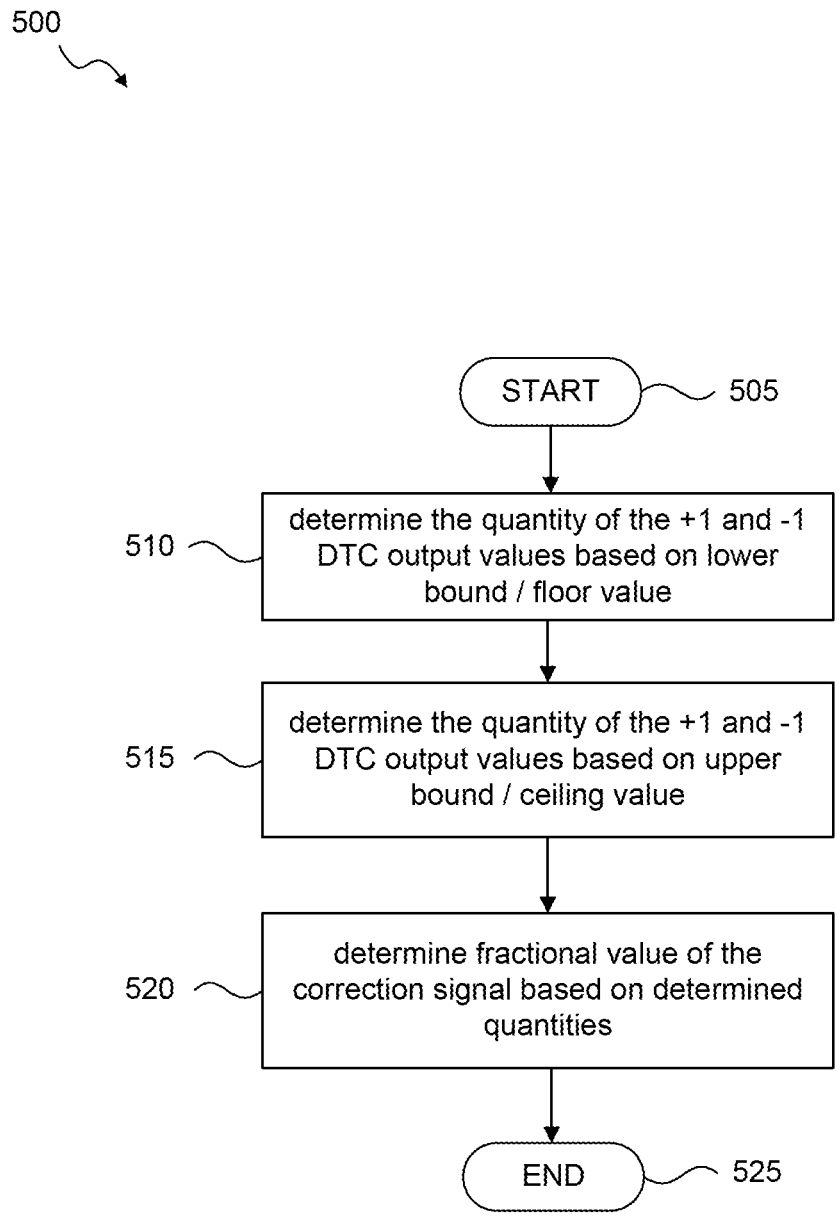
FIG. 5 illustrates a flowchart of a fine correction method according to an exemplary aspect of the present disclosure.

The fine correction process will be described with reference to FIG. 5, which illustrates a flowchart 500 of a fine correction method. In an exemplary aspect, if the INL values are within the jitter-range (e.g. if INL values≈jitter range), and thereby resulting in the histogram distribution for the particular DTC code producing both positive and negative integral nonlinearity values, and the output of the TDC 210 approaches and/or achieves a 50:50 distribution, a fine correction process is performed. The coarse correction process and the fine correction process can be performed sequentially, or the fine correction process can be performed without a previous coarse correction process being performed (e.g. if the DTC code producing both positive and negative integral nonlinearity values; the INL values are within the jitter-range).

In an exemplary aspect, the statistics processor 245 is configured to determine a fractional value of the PD-LUT (this can be used later for rounding or dithering). In this example, the two closest integer values (lower and upper bound values) for the PD-LUT 240 are known for the desired DTC code. This can be known based on the adjustments of the PD-LUT 245 in the coarse correction process, for example.

In exemplary aspect, the statistics processor 245 is configured to control the PD-LUT 240 and code ramp 235 to drive the DTC 220 with the two closest integer values. The statistics processor 245 then gathers statistics to: determine the quantity of the +1 and −1 DTC 210 output values when the smaller integer value (lower bound/floor value) is used to adjust the PD-LUT 240 (operation 510); and determine the quantity of the +1 and −1 DTC 210 output values when the larger integer value (upper bound/ceiling value) is used to adjust the PD-LUT 240 (operation 515).

Based on the determined quantities, the fractional value of the correction signal of the statistics processor 245 is determined (operation 520). In an exemplary aspect, the fractional value ($LUT_{fractional}(C)$) is determined using the following equation:

$$LUT_{fractional}(C) = LUT_{PD}(C) + \frac{Q^{-1}\left(\frac{f_{-1}}{f_{-1}+f_{+1}}\right)}{Q^{-1}\left(\frac{f_{-1}}{f_{-1}+f_{+1}}\right) - Q^{-1}\left(\frac{c_{-1}}{c_{-1}+c_{+1}}\right)}$$

where:
$LUT_{PD}(C)$ is the lower bound/floor value,
$Q^{-1}(\cdot)$ is the inverse Q-function,
$f_{-1}$ is the number of −1 s received when transmitting the lower bound/floor value,
$f_{+1}$ is the number of +1 s received when transmitting the lower bound/floor value,
$c_{-1}$ is the number of −1 s received when transmitting the upper bound/ceiling value, and
$c_{+1}$ is the number of +1 s received when transmitting the upper bound/ceiling value.

Advantageously, the determination of the fractional value is determinable according to exemplary aspects without requiring knowledge of the jitter-sigma-RMS. However, as would be understood by one of ordinary skilled the art, the calculation of the factional value is not limited thereto.

In an exemplary, if the jitter is extremely small as compared to the DTC resolution, the clock generator 200 can be configured to increase the amount of samples (i.e. number of statistics obtained) and/or increase the jitter sigma. The increase in the jitter sigma can be achieved by reducing the bandwidth of the loop filter 215. In this example, the reduction in bandwidth will increase the VCO jitter.

In an exemplary aspect, an initial calibration of the PLL 203 can be performed to correct INL resulting from production variability (i.e. production-caused INL). This initial calibration can use both the coarse and fine corrections. Subsequent, online calibrations can be performed to compensate for environmental changes (e.g. temperature), changes in frequency of the VCO, or the like. Given the likely minimal adjustments in the online calibrations, it is most likely that only a fine correction is needed, but a coarse correction can be employed if needed.

EXAMPLES

The following examples pertain to further aspects.

Example 1 is a clock generator calibration system, comprising: a phased-locked loop (PLL) configured to generate an output clock signal; and correction circuit that is configured to adjust a frequency signal of the PLL based on a digital signal of the PLL, the digital signal being generated based on the adjusted frequency signal.

Example 2 is the subject matter of Example 1, wherein the frequency signal is a reference clock signal, the output clock signal being generated based on the reference clock signal.

Example 3 is the subject matter of Example 1, wherein the frequency signal corresponds to the output clock signal, the frequency signal being a feedback signal within the PLL.

Example 4 is the subject matter of any of Examples 1-3, wherein the PLL comprises: a time-to-digital converter configured to generate the digital signal, the output clock signal being generated based on the digital signal; and a digital-to-time converter that is configured to generate the adjusted frequency signal based on the digital signal.

Example 5 is the subject matter of any of Examples 1-4, wherein correction circuit is configured to determine statistics of values of the digital signal, the adjustment of the frequency signal being based on the determined statistics.

Example 6 is the subject matter of any of Examples 1-5, wherein correction circuit comprises: a code ramp configured to generate a code; a statistics processor that is configured to generate a correction signal based on the generated code and the digital signal; and a pre-distortion lookup table (PD-LUT) that is configured to generate a control signal that controls the adjustment of the frequency signal based on the correction signal and the generated code.

Example 7 is the subject matter of any of Examples 1 and 3-6, wherein the PLL comprises: a time-to-digital converter configured to generate the digital signal based on the adjusted frequency signal and a reference signal; a controlled oscillator that is configured to generate the output clock signal based on the digital signal, the frequency signal being based on the output clock signal; and a digital-to-time converter in a feedback loop of the PLL, and configured to receive, via the feedback loop, the frequency signal is configured to generate the adjusted frequency signal based on the digital signal.

Example 8 is the subject matter of any of Examples 1, 2, and 4-6, wherein: the PLL comprises: a time-to-digital converter configured to generate the digital signal based on the adjusted frequency signal and feedback signal being associated with the output clock signal; and a controlled oscillator that is configured to generate the output clock signal based on the digital signal; and a digital-to-time converter configured to receive the frequency signal and configured to generate the adjusted frequency signal based on the digital signal, the frequency signal being a reference clock signal.

Example 9 is the subject matter of any of Examples 1-8, wherein correction circuit comprises: a code ramp configured to generate a code; a statistics processor that is configured to generate a correction signal based on the generated code and the digital signal; and a pre-distortion lookup table (PD-LUT) that is configured to generate a control signal and provide the control signal to the digital-to-time converter, the control signal controlling the adjustment of the frequency signal by the digital-to-time converter based on the correction signal and the generated code.

Example 10 is the subject matter of any of Examples 4-8, wherein the time-to-digital converter is a bang-bang time-to-digital converter.

Example 11 is the subject matter of Example 9, wherein the time-to-digital converter is a bang-bang time-to-digital converter.

Example 12 is a non-transitory computer-readable storage medium with an executable computer program stored thereon, the program instructing a processor to: generate, by an PLL, an output clock signal based on a reference clock signal; and adjust a frequency signal of the PLL based on a digital signal of the PLL, the digital signal being generated based on the adjusted frequency signal.

Example 13 is the subject matter of Example 12, wherein the frequency signal is a reference clock signal, the output clock signal being generated based on the reference clock signal.

Example 14 is the subject matter of Example 12, wherein the frequency signal corresponds to the output clock signal, the frequency signal being a feedback signal within the PLL.

Example 15 is the subject matter of any of Examples 12-14, wherein the PLL comprises: a time-to-digital converter configured to generate the digital signal, the output clock signal being generated based on the digital signal; and a digital-to-time converter that is configured to generate the adjusted frequency signal based on the digital signal.

Example 16 is the subject matter of any of Examples 12-15, wherein the program further instructs the processor to determine statistics of values of the digital signal, the adjustment of the frequency signal being based on the determined statistics.

Example 17 is the subject matter of any of Examples 12-16, wherein the frequency signal is adjusted using a correction circuit that comprises: a code ramp configured to generate a code; a statistics processor that is configured to generate a correction signal based on the generated code and the digital signal; and a pre-distortion lookup table (PD-LUT) that is configured to generate a control signal that controls the adjustment of the frequency signal based on the correction signal and the generated code.

Example 18 is the subject matter of any of Examples 12 and 14-17, wherein the PLL comprises: a time-to-digital converter configured to generate the digital signal based on the adjusted frequency signal and a reference signal; a controlled oscillator that is configured to generate the output clock signal based on the digital signal, the frequency signal being based on the output clock signal; and a digital-to-time converter in a feedback loop of the PLL, and configured to receive, via the feedback loop, the frequency signal, and to generate the adjusted frequency signal based on the digital signal.

Example 19 is the subject matter of any of Examples 12, 13, and 15-17, wherein the PLL comprises: a time-to-digital converter configured to generate the digital signal based on the adjusted frequency signal and feedback signal being associated with the output clock signal; a controlled oscillator that is configured to generate the output clock signal based on the digital signal; and a digital-to-time converter configured to receive the frequency signal and configured to generate the adjusted frequency signal based on the digital signal, the frequency signal being a reference clock signal.

Example 20 is the subject matter of any of Examples 18-19, wherein the frequency signal is adjusted using a correction circuit that comprises: a code ramp configured to generate a code; a statistics processor that is configured to generate a correction signal based on the generated code and the digital signal; and a pre-distortion lookup table (PD-LUT) that is configured to generate a control signal and provide the control signal to the digital-to-time converter, the control signal controlling the adjustment of the frequency signal by the digital-to-time converter based on the correction signal and the generated code.

Example 21 is a communication device comprising a clock generator calibration system of any of claims 1-11.

Example 22 is the subject matter of Example 21, wherein the clock generator calibration system is comprised with a transceiver of the communication device.

Example 23 is a clock generator calibration method, comprising: generating, by an PLL, an output clock signal based on a reference clock signal; and adjusting a frequency signal of the PLL based on a digital signal of the PLL, the digital signal being generated based on the adjusted frequency signal.

Example 24 is the subject matter of Example 23, wherein the frequency signal is a reference clock signal, the output clock signal being generated based on the reference clock signal.

Example 25 is the subject matter of Example 23, wherein the frequency signal corresponds to the output clock signal, the frequency signal being a feedback signal within the PLL.

Example 26 is the subject matter of any of Examples 23-25, wherein the PLL comprises: a time-to-digital converter configured to generate the digital signal, the output clock signal being generated based on the digital signal; and a digital-to-time converter that is configured to generate the adjusted frequency signal based on the digital signal.

Example 27 is the subject matter of any of Examples 23-26, further comprising determining statistics of values of the digital signal, the adjustment of the frequency signal being based on the determined statistics.

Example 28 is the subject matter of any of Examples 23-27, wherein the frequency signal is adjusted using a correction circuit that comprises: a code ramp configured to generate a code; a statistics processor that is configured to generate a correction signal based on the generated code and the digital signal; and a pre-distortion lookup table (PD-LUT) that is configured to generate a control signal that controls the adjustment of the frequency signal based on the correction signal and the generated code.

Example 29 is the subject matter of any of Examples 23 and 25-28, wherein the PLL comprises: a time-to-digital converter configured to generate the digital signal based on the adjusted frequency signal and a reference signal; a controlled oscillator that is configured to generate the output clock signal based on the digital signal, the frequency signal being based on the output clock signal; and a digital-to-time converter in a feedback loop of the PLL, and configured to receive, via the feedback loop, the frequency signal, and to generate the adjusted frequency signal based on the digital signal.

Example 30 is the subject matter of any of Examples 23, 24, and 26-28, wherein the PLL comprises: a time-to-digital converter configured to generate the digital signal based on the adjusted frequency signal and feedback signal being associated with the output clock signal; a controlled oscillator that is configured to generate the output clock signal based on the digital signal; and a digital-to-time converter configured to receive the frequency signal and configured to generate the adjusted frequency signal based on the digital signal, the frequency signal being a reference clock signal.

Example 31 is the subject matter of any of Examples 29-30, wherein the frequency signal is adjusted using a correction circuit that comprises: a code ramp configured to generate a code; a statistics processor that is configured to generate a correction signal based on the generated code and the digital signal; and a pre-distortion lookup table (PD-LUT) that is configured to generate a control signal and provide the control signal to the digital-to-time converter, the control signal controlling the adjustment of the frequency signal by the digital-to-time converter based on the correction signal and the generated code.

Example 32 is a non-transitory computer-readable storage medium with an executable computer program stored thereon, the program instructing a processor to perform the operations of any of Examples 23-31.

Example 33 is a computer program product having a computer program which is directly loadable into a memory of a controller, when executed by the controller, causes the controller to perform the operations of any of Examples 23-31.

Example 34 is an apparatus as shown and described.

Example 35 is a method as shown and described.

Example 36 is a non-transitory computer-readable storage medium with an executable computer program stored thereon, the program instructing a processor to perform the method of Example 35.

Conclusion

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. For example, a circuit includes an analog circuit, a digital circuit, state machine logic, data processing circuit, a programmable processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

As will be apparent to a person of ordinary skill in the art based on the teachings herein, exemplary aspects are not limited to communication protocols described herein. The exemplary aspects can be applied to other wireless communication protocols/standards (e.g., LTE or other cellular protocols, other IEEE 802.11 protocols, etc.) as would be understood by one of ordinary skill in the relevant arts.

What is claimed is:

1. A clock generator calibration system, comprising:
    a phased-locked loop (PLL) configured to generate an output clock signal; and
    a correction circuit, comprising:
        a code ramp configured to generate digital-to-time converter (DTC) codes; and
        a statistics processor configured to:
            sample values of a digital signal of the PLL;
            determine a distribution of the sampled values of the digital signal of the PLL per each respectively received one of the DTC codes; and
            generate a correction signal based on the distribution,
    wherein the correction circuit is configured to generate a control signal based on the correction signal and a generated DTC code from among the generated DTC codes, and to cause the PLL to adjust a frequency signal of the PLL to provide an adjusted frequency signal based on the digital signal of the PLL, the digital signal being generated based on the adjusted frequency signal.

2. The clock generator calibration system of claim 1, wherein the frequency signal is a reference clock signal, the output clock signal being generated based on the reference clock signal.

3. The clock generator calibration system of claim 1, wherein the frequency signal corresponds to the output clock signal, the frequency signal being a feedback signal within the PLL.

4. The clock generator calibration system of claim 1, wherein the PLL comprises:
    a time-to-digital converter configured to generate the digital signal, the output clock signal being generated based on the digital signal; and
    a digital-to-time converter configured to generate the adjusted frequency signal based on the digital signal.

5. The clock generator calibration system of claim 4, wherein the time-to-digital converter is a bang-bang time-to-digital converter.

6. The clock generator calibration system of claim 1, wherein the correction circuit further comprises:
    a pre-distortion lookup table (PD-LUT) configured to generate the control signal.

7. The clock generator calibration system of claim 6, wherein the PD-LUT is configured to generate the control signal and to provide the control signal to a DTC, the control signal controlling the adjustment of the frequency signal by the DTC based on the correction signal and the generated DTC code.

8. The clock generator calibration system of claim 1, wherein the PLL comprises:

a time-to-digital converter configured to generate the digital signal based on the adjusted frequency signal and a reference signal;

a controlled oscillator configured to generate the output clock signal based on the digital signal, the frequency signal being based on the output clock signal; and a digital-to-time converter in a feedback loop of the PLL, the digital-to-time converter being configured to (i) receive, via the feedback loop of the PLL, the frequency signal, and (ii) generate the adjusted frequency signal based on the digital signal.

9. The clock generator calibration system of claim 8, wherein the time-to-digital converter is a bang-bang time-to-digital converter.

10. The clock generator calibration system of claim 1, wherein the PLL comprises:

a time-to-digital converter configured to generate the digital signal based on the adjusted frequency signal, which is generated based on a feedback signal associated with the output clock signal;

a controlled oscillator configured to generate the output clock signal based on the digital signal; and a digital-to-time converter configured to (i) receive the frequency signal, and (ii) generate the adjusted frequency signal based on the digital signal, wherein the frequency signal is a reference clock signal.

11. The clock generator calibration system of claim 1, wherein the correction circuit is configured to determine a histogram distribution of the sampled digital signal of the PLL per each respectively received one of the DTC codes, and to generate the correction signal based on the histogram distribution.

12. The clock generator calibration system of claim 1, wherein the correction circuit further comprises:

a pre-distortion lookup table (PD-LUT) configured to generate the control signal, wherein the correction signal is indicative of an offset value based on the determined distribution of the sampled digital signal of the PLL, and wherein the correction signal causes the PD-LUT to adjust an offset output so that the distribution of the sampled digital signal of the PLL approaches and/or achieves a 50:50 distribution.

13. A non-transitory computer-readable storage medium with an executable computer program stored thereon, the program instructing a processor to:

generate, by a phase-locked loop (PLL), an output clock signal based on a reference clock signal;

generate a control signal to cause the PLL to adjust a frequency signal of the PLL to provide an adjusted frequency signal based on a digital signal of the PLL, the digital signal being generated based on the adjusted frequency signal;

sample the digital signal of the PLL;

determine a distribution of the sampled digital signal of the PLL per each respectively received digital-to-time converter (DTC) code from among generated DTC codes; and generate a correction signal based on the distribution, wherein the frequency signal is adjusted using a correction circuit that comprises;

a code ramp configured to generate the DTC codes; and a statistics processor configured to generate the correction signal, wherein the correction circuit generates the control signal based upon the correction signal and a generated DTC code from among the generated DTC codes.

14. The non-transitory computer-readable storage medium of claim 13, wherein the frequency signal is a reference clock signal, the output clock signal being generated based on the reference clock signal.

15. The non-transitory computer-readable storage medium of claim 13, wherein the frequency signal corresponds to the output clock signal, the frequency signal being a feedback signal within the PLL.

16. The non-transitory computer-readable storage medium of claim 13, wherein the PLL comprises:

a time-to-digital converter configured to generate the digital signal, the output clock signal being generated based on the digital signal; and a digital-to-time converter configured to generate the adjusted frequency signal based on the digital signal.

17. The non-transitory computer-readable storage medium of claim 13, wherein the correction circuit further comprises a pre-distortion lookup table (PD-LUT) configured to generate the control signal.

18. The non-transitory computer-readable storage medium of claim 17, wherein the PD-LUT is configured to generate the control signal and to provide the control signal to a DTC, the control signal controlling the adjustment of the frequency signal by the DTC based on the correction signal and the generated DTC code.

19. The non-transitory computer-readable storage medium of claim 13, wherein the PLL comprises:

a time-to-digital converter configured to generate the digital signal based on the adjusted frequency signal and a reference signal;

a controlled oscillator configured to generate the output clock signal based on the digital signal, the frequency signal being based on the output clock signal; and a digital-to-time converter in a feedback loop of the PLL, the digital-to-time converter being configured to (i) receive, via the feedback loop, the frequency signal of the PLL, and (ii) generate the adjusted frequency signal based on the digital signal.

20. The non-transitory computer-readable storage medium of claim 13, wherein the PLL comprises:

a time-to-digital converter configured to generate the digital signal based on the adjusted frequency signal, which is generated based on a feedback signal associated with the output clock signal;

a controlled oscillator configured to generate the output clock signal based on the digital signal; and a digital-to-time converter configured to (i) receive the frequency signal, and (ii) generate the adjusted frequency signal based on the digital signal, wherein the frequency signal is a reference clock signal.

21. A communication device, comprising:

processor circuitry; and a clock generator calibration system, comprising:

a phased-locked loop (PLL) configured to generate an output clock signal; and a correction circuit, comprising:

a code ramp configured to generate digital-to-time converter (DTC) codes; and a statistics processor configured to:

sample values of a digital signal of the PLL;

determine a distribution of the sampled values of the digital signal of the PLL per each respectively received one of the DTC codes; and generate a correction signal based on the distribution, wherein the correction circuit is configured to generate a control signal based upon the correction signal and a generated DTC code from among the generated DTC codes, and to cause the PLL to adjust a frequency signal of the PLL to provide an adjusted frequency signal based on the digital signal of the PLL, the digital signal being generated based on the adjusted frequency signal.

* * * * *